(12) United States Patent
Takatsu

(10) Patent No.: US 11,201,101 B2
(45) Date of Patent: Dec. 14, 2021

(54) ELECTRONIC COMPONENT

(71) Applicant: SHINDENGEN ELECTRIC MANUFACTURING CO., LTD., Tokyo (JP)

(72) Inventor: Norio Takatsu, Saitama (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 16 days.

(21) Appl. No.: 16/636,609

(22) PCT Filed: Oct. 26, 2017

(86) PCT No.: PCT/JP2017/038697
§ 371 (c)(1),
(2) Date: Feb. 4, 2020

(87) PCT Pub. No.: WO2019/082333
PCT Pub. Date: May 2, 2019

(65) Prior Publication Data
US 2020/0381335 A1 Dec. 3, 2020

(51) Int. Cl.
*H01L 23/42* (2006.01)
*H01L 23/31* (2006.01)
*H01L 23/00* (2006.01)

(52) U.S. Cl.
CPC .......... *H01L 23/42* (2013.01); *H01L 23/3107* (2013.01); *H01L 24/32* (2013.01);
(Continued)

(58) Field of Classification Search
CPC .......... H01L 24/40; H01L 2224/33181; H01L 2224/4005; H01L 2224/40105;
(Continued)

(56) References Cited

U.S. PATENT DOCUMENTS

2007/0145540 A1* 6/2007 Mochida .................. H01L 24/49
257/659
2013/0056885 A1 3/2013 Minamio et al.
(Continued)

FOREIGN PATENT DOCUMENTS

JP 2013070026 A 4/2013
JP 2013074035 A 4/2013
(Continued)

OTHER PUBLICATIONS

Decision to Grant a Patent from JP app. No. 2019-549770, dated Dec. 1, 2020, with English translation from Global Dossier.
(Continued)

*Primary Examiner* — Tucker J Wright
(74) *Attorney, Agent, or Firm* — Ladas & Parry, LLP

(57) ABSTRACT

An electronic component has a base 10; an electronic element 20 provided on one side of the base 10; a connecting body 30 provided on one side of the electronic element 20; a heat dissipating block 40 provided on one side of the connecting body 30; an insulating part 50 provided between the connecting body 30 and the heat dissipating block 40; and a sealing part 90 in which the electronic element 20, the connecting body 30 and the insulating part 50 are sealed. At least a part of a surface on another side of the base 10 is exposed from the sealing part 90. At least a part of a surface on one side of the heat dissipating block 40 is exposed from the sealing part 90.

7 Claims, 7 Drawing Sheets

(52) U.S. Cl.
CPC .............. *H01L 24/33* (2013.01); *H01L 24/40* (2013.01); *H01L 24/73* (2013.01); *H01L 2224/32245* (2013.01); *H01L 2224/33181* (2013.01); *H01L 2224/4005* (2013.01); *H01L 2224/40105* (2013.01); *H01L 2224/40175* (2013.01); *H01L 2224/40475* (2013.01); *H01L 2224/73263* (2013.01)

(58) Field of Classification Search
CPC . H01L 2224/40175; H01L 2224/40475; H01L 24/84
See application file for complete search history.

(56) References Cited

U.S. PATENT DOCUMENTS

| 2013/0062745 | A1 | 3/2013 | Kimura |
| 2015/0206864 | A1 | 7/2015 | Harazono |
| 2017/0317006 | A1 | 11/2017 | Okumura |
| 2017/0323839 | A1 | 11/2017 | Ariki |

FOREIGN PATENT DOCUMENTS

| JP | 2014060325 | A | 4/2014 |
| JP | 2016018979 | A | 2/2016 |
| JP | 2016100479 | A | 5/2016 |
| JP | 2016105523 | A | 6/2016 |
| WO | 2012137439 | A1 | 10/2012 |

OTHER PUBLICATIONS

International Preliminary Report on Patentability from PCT/JP2017/038697, dated May 2, 2019, with English translation provided by WIPO.

International Search Report in the international application No. PCT/JP2017/038697, dated Jan. 16, 2018.

Written Opinion of the International Searching Authority in the international application No. PCT/JP2017/038697 dated Jan. 16, 2018.

\* cited by examiner

ELECTRONIC COMPONENT

CROSS-REFERENCE TO RELATED APPLICATION

The present application is the U.S. national phase of PCT Application PCT/JP2017/038697 filed on Oct. 26, 2017, the disclosure of which is incorporated herein by reference in its entirety.

TECHNICAL FIELD

The present invention relates to an electronic component having a base and an electronic element provided in a sealing part.

BACKGROUND ART

Conventionally, in electronic components such as electronic devices or electronic modules, a metal substrate or the like having a rear surface exposed in order to increase heat dissipation efficiency is placed on a heat sink or the like via an insulating part such as an insulating sheet interposed between the metal substrate and the heat sink. Electronic components configured to dissipate heat from both surfaces are also known. Such electronic components are provided with, as disclosed in JP 2016-100479 A, for example, a semiconductor chip, a sealing resin body by which the semiconductor chip is sealed, a first conductor plate (first heat sink) disposed on a first main surface of the semiconductor chip and electrically connected to a first main electrode, and a second conductor plate (second heat sink) disposed on a second main surface of the semiconductor chip and electrically connected to a second main electrode. Then, first and second substrates are each in contact with a cooler via an insulating plate interposed between each substrate and the cooler.

SUMMARY OF INVENTION

Technical Problem

In the conventionally used aspects, since an electronic element such as a semiconductor element included in a sealing part and a conductor plate are electrically connected to each other in an electronic component, an insulating part such as an insulating plate or an insulating sheet needs to be provided between a cooling member such as a heat sink and the electronic component. However, providing such an insulating part reduces manufacturing efficiency.

The present invention has been made in view of the above circumstances and provides an electronic component that need not be provided with an insulating part such as an insulating sheet even between a cooling member such as a heat sink and a surface of the electronic component serving to dissipate heat.

Solution to Problem

[Concept 1]
An electronic component according to concept 1 may comprise:
a base;
an electronic element provided on one side of the base;
a connecting body provided on one side of the electronic element;
a heat dissipating block provided on one side of the connecting body;
an insulating part provided between the connecting body and the heat dissipating block; and
a sealing part in which the electronic element, the connecting body and the insulating part are sealed, and wherein
at least a part of a surface on another side of the base may be exposed from the sealing part, and
at least a part of a surface on one side of the heat dissipating block may be exposed from the sealing part.
[Concept 2]
In the electronic component according to concept 1,
a distal end part of the connecting body may be bent toward the other side via a bent part, and
the insulating part may be provided on one side of the distal end part.
[Concept 3]
In the electronic component according to concept 1 or 2,
a distal end part of the connecting body may have a recessed part, and
the insulating part may be provided in the recessed part.
[Concept 4]
In the electronic component according to any one of concepts 1 to 3,
the heat dissipating block may have a heat dissipating block main part and an extending part extending from the heat dissipating block main part toward the other side,
the extending part may be provided on one side of a distal end part of the connecting body, and
a surface on one side of the heat dissipating block main part may be exposed from the sealing part.
[Concept 5]
In the electronic component according to concept 4,
a distal end part of the connecting body may have a recessed part, and
the insulating part and the extending part may be provided in the recessed part.
[Concept 6]
In the electronic component according to any one of concepts 1 to 5,
the insulating part may be a heat-dissipating and insulating sheet or a heat-dissipating and insulating material.
[Concept 7]
In the electronic component according to any one of concepts 1 to 6,
the insulating part may be an elastic member having a heat-dissipating and insulating property.
[Concept 8]
In the electronic component according to concept 7, the insulating part may have a thickness in a range of from 1/5 to 1/1 of a thickness of a distal end part of the connecting body.
[Concept 9]
In the electronic component according to any one of concepts 1 to 8,
a proximal end part of the connecting body may be brought into contact with a surface on one side of a terminal exposed outward from the sealing part via a conductive adhesive.
[Concept 10]
In the electronic component according to any one of concepts 1 to 9,
only the heat dissipating block may be exposed from one side of the sealing part.
[Concept 11]
In the electronic component according to any one of concepts 1 to 10, the base, the heat dissipating block and the connecting body may be made of same material.

[Concept 12]

In the electronic component according to any one of concepts 1 to 11, a surface on the other side of the heat dissipating block may have a roughened surface.

Advantageous Effects of Invention

According to the present invention, the insulating part is provided between the connecting body provided on one side of the electronic element and the heat dissipating block, so that the heat dissipating block and the electronic element are electrically insulated from each other. Accordingly, a cooling member such as a heat sink can be directly placed on a surface that is on the heat dissipating block side and serves to dissipate heat.

DESCRIPTION OF EMBODIMENTS

First Embodiment

<<Configuration>>

Hereinafter, a description will be given of an electronic component of the present embodiment. The electronic component of the present embodiment is, for example, an electronic device or an electronic module. Examples of the electronic device include a semiconductor device, and examples of the electronic module include a semiconductor module. Further, an electronic element of the present embodiment is typically a semiconductor element, and may be a switching element formed of a semiconductor such as a MOSFET or IGBT, or may be a capacitor. In the present embodiment, one side is equivalent to an upper side of FIG. 1, and the other type is equivalent to a lower side of FIG. 1. A surface of which normal direction coincides with a vertical direction of FIG. 1 (that is, a direction including a direction toward the one side and a direction toward the other side) is referred to as "plane direction" in the present embodiment.

Figure 1:
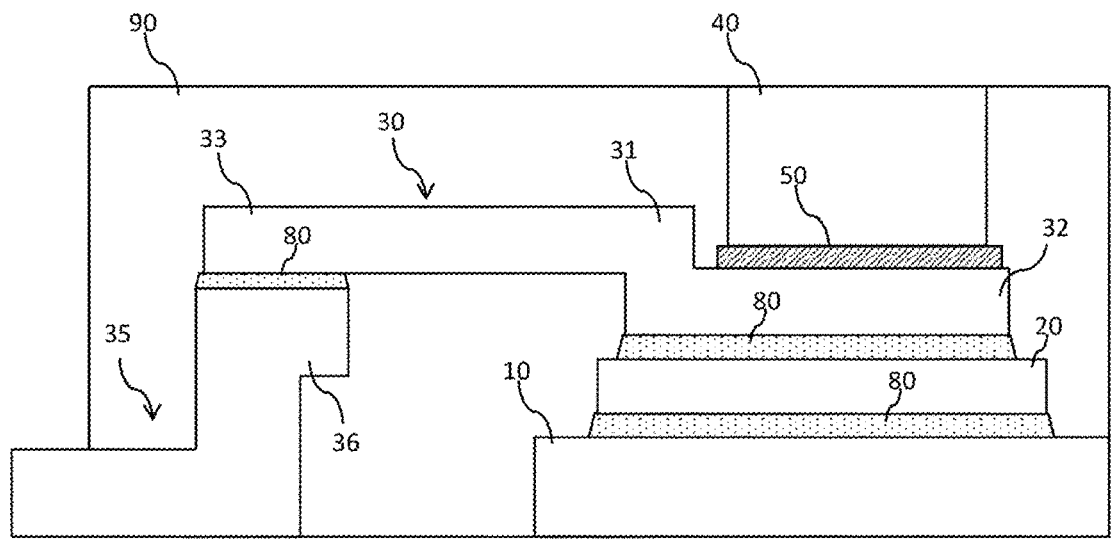
FIG. 1 is a side cross-sectional view of an electronic component applicable to a first embodiment of the present invention.

As shown in FIG. 1, the electronic component may have a base 10, an electronic element 20 provided on one side of the base 10, a connecting body 30 provided on one side of the electronic element 20, a heat dissipating block 40 provided on one side of the connecting body 30, an insulating part 50 provided between the connecting body 30 and the heat dissipating block 40, and a sealing part 90 in which the electronic element 20, the connecting body 30, and the insulating part 50 are sealed. At least a part of a surface on the other side of the base 10 may be exposed from the sealing part 90. At least a part of a surface on one side of the heat dissipating block 40 may be exposed from the sealing part 90.

A conductive adhesive 80 such as solder may be provided between a surface on the one side of the base 10 and a surface on the other side of the electronic element 20. The conductive adhesive 80 such as solder may be further provided between a surface on the one side of the electronic element 20 and a surface on the other side of a distal end part 32 of the connecting body 30.

As described above, at least the part of the surface on the other side of the base 10 may be exposed from the sealing part 90, but, rather than the part of the surface on the other side of the base 10, all of the surface on the other side of the base 10 may be exposed from the sealing part 90. As described above, at least the part of the surface on the one side of the heat dissipating block 40 may be exposed from the sealing part 90, but, rather than the part of the surface on the one side of the heat dissipating block 40, all of the surface on the one side of the heat dissipating block 40 may be exposed from the sealing part 90.

Figure 2:
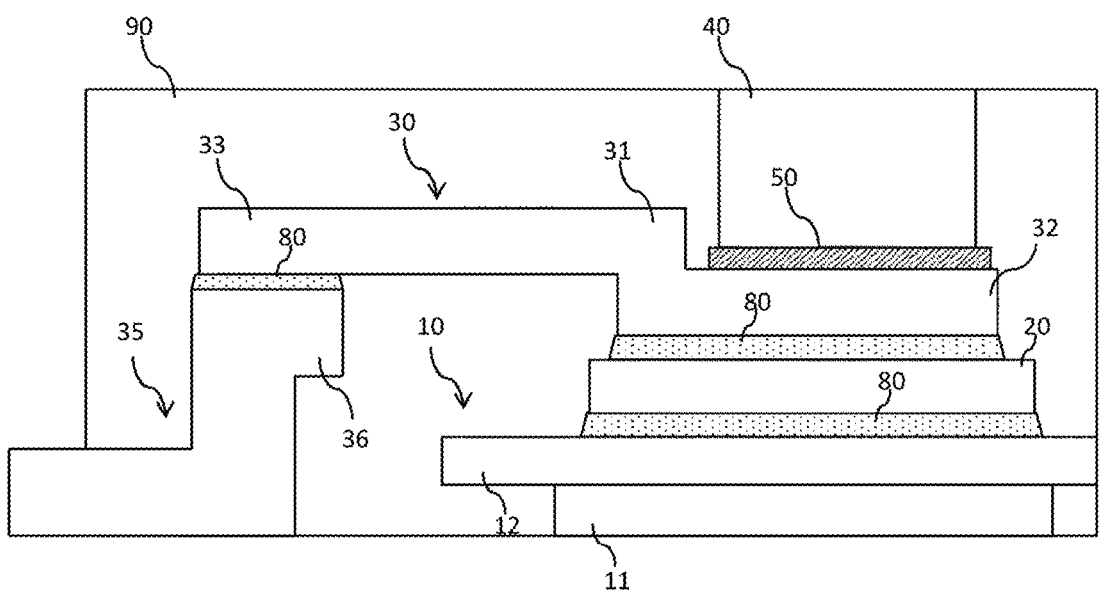
FIG. 2 is a side cross-sectional view of an electronic component applicable to a first modification of the first embodiment of the present invention.

When only part of the surface on the other side of the base 10 is exposed, for example, as shown in FIG. 2, the base 10 may have a base main part 12 and a base protruding part 11 protruding from the base main part 12 toward the other side, and part of a surface on the other side of the base protruding part 11 may be exposed from the sealing part 90.

Figure 3:
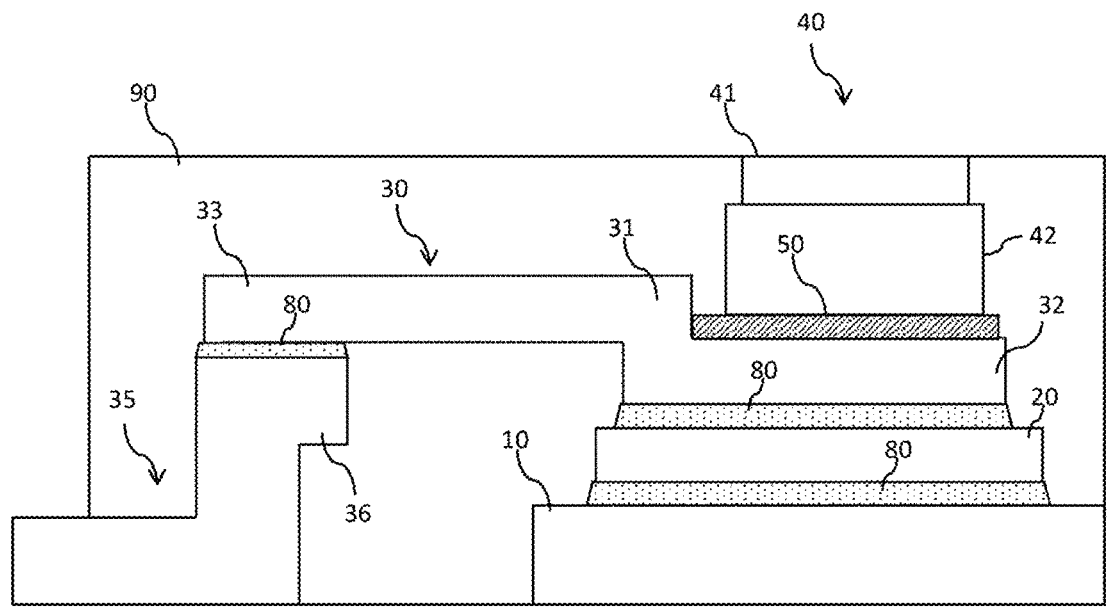
FIG. 3 is a side cross-sectional view of an electronic component applicable to a second modification of the first embodiment of the present invention.

When only part of the surface on the one side of the heat dissipating block 40 is exposed, for example, as shown in FIG. 3, the heat dissipating block 40 may have a heat dissipating block main part 42 and a heat dissipating block protruding part 41 protruding from the heat dissipating block main part 42 toward the one side, and a surface on one side of the heat dissipating block protruding part 41 may be exposed from the sealing part 90.

The distal end part 32 of the connecting body 30 may be bent toward the other side via a bent part 31. On the distal end part 32, the insulating part 50 and the heat dissipating block 40 may be provided.

The heat dissipating block 40 may be formed in a cylindrical shape or an approximate rectangular prism. In the present embodiment, the approximate rectangular prism is equivalent to an aspect that is a hexahedron where two opposing surfaces are arranged in parallel and includes an aspect where corners are rounded, for example. An approximate cube is equivalent to an aspect that is a hexahedron where two opposing surfaces are arranged in parallel, and all surfaces have the same size, and includes an aspect where corners are rounded like the approximate rectangular prism, for example.

The insulating part 50 may be a heat-dissipating and insulating sheet or a heat-dissipating and insulating material. Examples of the heat-dissipating and insulating sheet include a high heat conductive sheet resulting from adding a filler such as alumina, aluminum nitride, or boron nitride to silicon. Examples of the heat-dissipating and insulating material include an epoxy resin, a silicon resin, or an urethane resin containing a filler such as alumina, aluminum nitride, or boron nitride.

The insulating part 50 may be an elastic member having heat-dissipating and insulating properties. Examples of such an elastic member include silicon rubber containing a filler such as alumina, aluminum nitride, or boron nitride.

The insulating part 50 may have a thickness in a range of from $1/5$ to $1/1$ of a thickness of the distal end part 32 of the connecting body 30 and, more precisely, have a thickness in a range of from $1/3$ to $1/2$. An increase in thickness of the insulating part 50 can increase dielectric strength.

Figure 4:
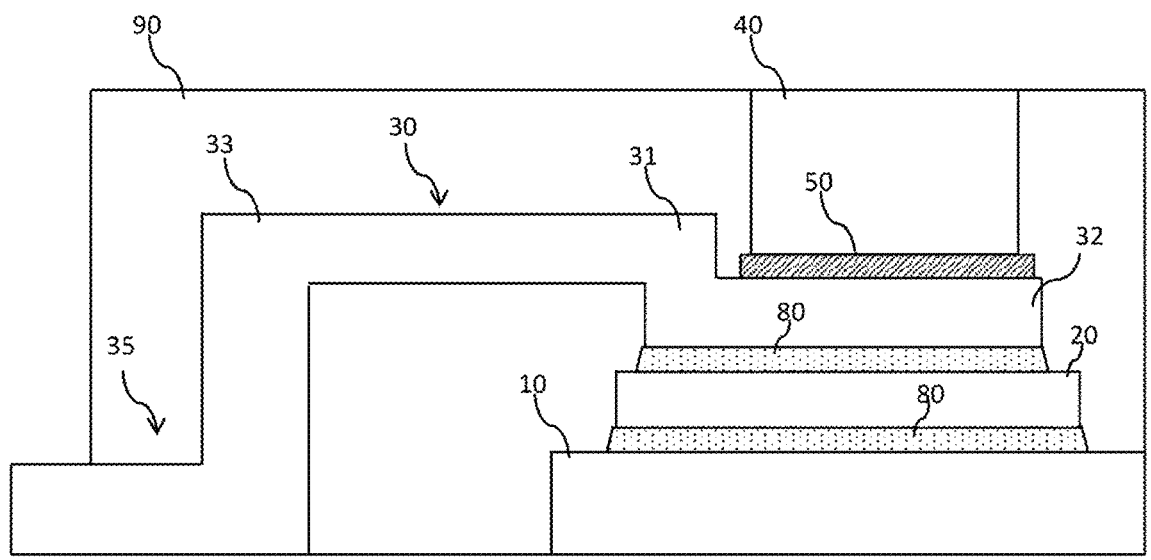
FIG. 4 is a side cross-sectional view of an electronic component applicable to a third modification of the first embodiment of the present invention.

As shown in FIG. 1 to FIG. 3, a proximal end part 33 of the connecting body 30 may be connected to one or a plurality of terminals 35 exposed outward from the sealing part 90. Further, the proximal end part 33 of the connecting body 30 may be brought into contact with a surface on one side of a proximal end part 36 of the terminal 35 exposed outward from the sealing part 90 via the conductive adhesive 80 such as solder interposed between the proximal end part 33 and the proximal end part 36. Note that, rather than the above-described configuration where the connecting body 30 and the terminal 35 are separated from each other, the proximal end part 33 of the connecting body 30 may be integrally formed with the terminal 35 as shown in FIG. 4. Further, the proximal end part 33 of the connecting body 30 may extends in the plane direction to protrude from a side surface of the sealing part 90.

Figure 11:
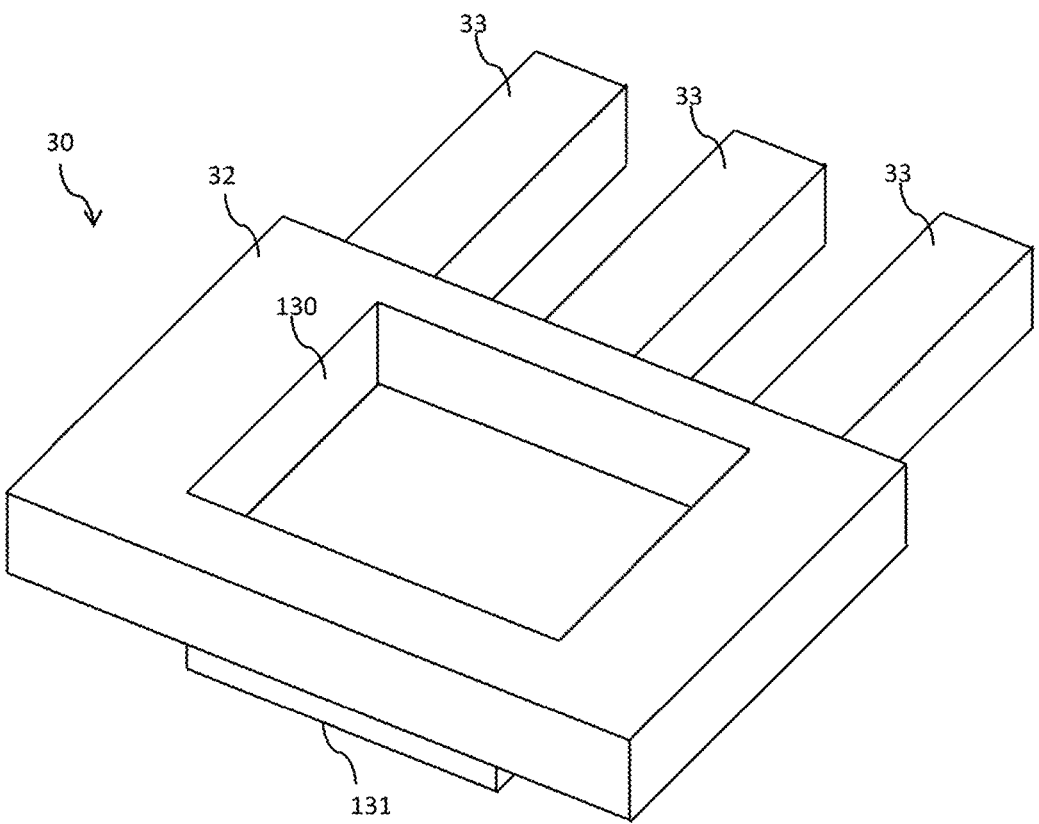
FIG. 11 is a perspective view of an electronic component applicable to a third embodiment of the present invention.
Figure 12:
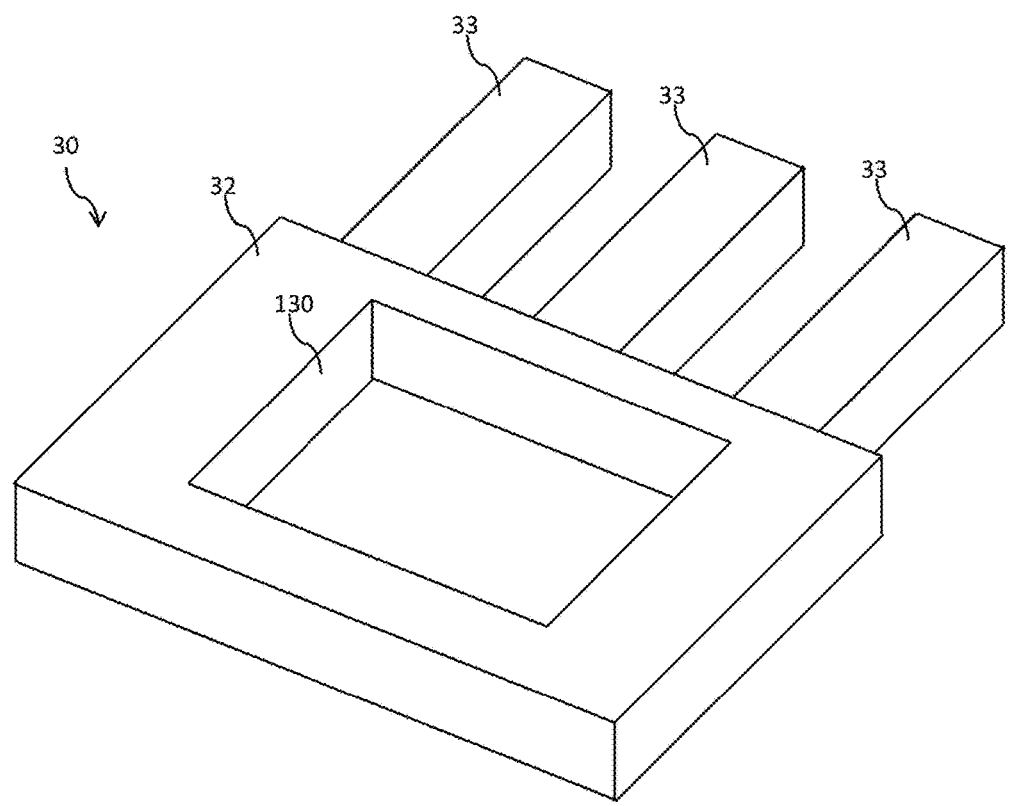
FIG. 12 is a perspective view of an electronic component applicable to a modification of the third embodiment of the present invention.

When the proximal end part 33 of the connecting body 30 is connected to the plurality of terminals 35, the plurality of terminals 35 may be arranged side by side in a front-rear direction of FIG. 1 that is the plane direction, and a surface on one side of each of the plurality of terminals 35 may be brought into contact with the proximal end part 33 of the connecting body 30 via the conductive adhesive 80 such as solder interposed between the surface on the one side of the terminal 35 and the proximal end part 33 (see FIG. 11 and FIG. 12). Further, the proximal end part 33 of the connecting body 30 and the plurality of terminals 35 may be integrally formed with each other, and in this case as well, the plurality of terminals 35 may be arranged side by side in the front-rear direction of FIG. 1 that is the plane direction.

In the electronic component of the present embodiment, only the heat dissipating block 40 may be exposed from one side of the sealing part 90.

The base 10, the heat dissipating block 40, and the connecting body 30 may be made of the same material. As an example, the base 10, the heat dissipating block 40, and the connecting body 30 may be each made of copper or metal containing copper.

<<Action/Effect>>

Next, a description will be given of an example of action/effect of the present embodiment having the above-described configuration. Note that all aspects that will be described in "Action/Effect" can be employed in the above-described configuration.

Figure 5:
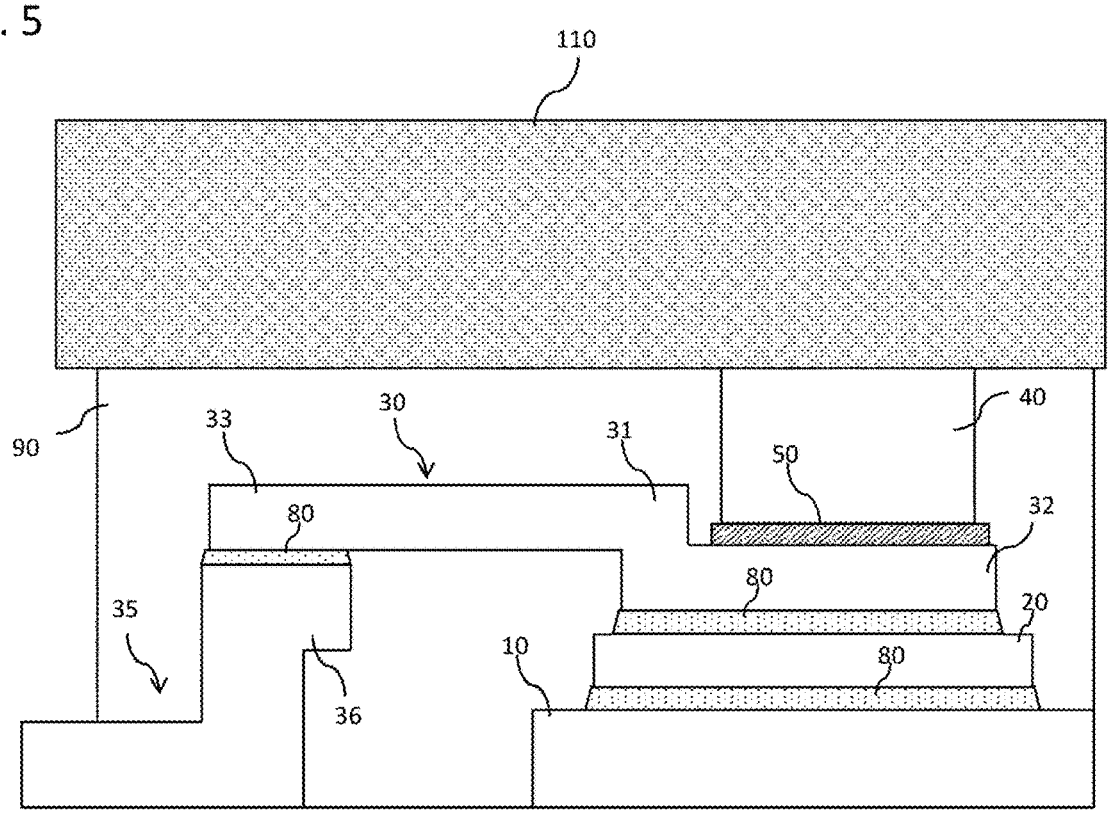
FIG. 5 is a side cross-sectional view of the electronic component and a cooling member that are applicable to the first embodiment of the present invention.

In the present invention, when an aspect is employed where the insulating part 50 is provided between the connecting body 30 provided on the one side of the electronic element 20 and the heat dissipating block 40, and the heat dissipating block 40 and the electronic element 20 are electrically insulated from each other, a cooling member 110 such as a heat sink can be directly placed on a surface that is on the heat dissipating block 40 side and serves to dissipate heat as shown in FIG. 5. This eliminates the need of separately providing a heat-dissipating and insulating sheet, a heat-dissipating and insulating material, or the like between the electronic component and the cooling member 110 such as a heat sink, and it is thus advantageous in that a degree of freedom in design can be increased. Note that, even when an electronic component as in the present embodiment is used, a heat-dissipating and insulating sheet, a heat-dissipating and insulating material, or the like may be provided between the electronic component and a cooling member such as a heat sink.

As shown in FIG. 1 and the like, when an aspect is employed where the distal end part 32 of the connecting body 30 is bent toward the other side via the bent part 31, and the insulating part 50 and the heat dissipating block 40 are provided on the distal end part 32, it is advantageous in that the insulating part 50 can be positioned in the plane direction by using the bent part 31. From this viewpoint, as shown in FIG. 3, it is advantageous in that a side surface of the insulating part 50 adjacent to the bent part 31 (a left surface in FIG. 3) is in contact with the bent part 31 to position the insulating part 50 in the plane direction.

When an aspect is employed where the heat dissipating block 40 is formed in an approximate rectangular prism or an approximate cube, it is advantageous in that the heat dissipating block 40 can be easily placed, during a manufacturing process, on the distal end part 32 that is bent toward the other side.

Figure 8:
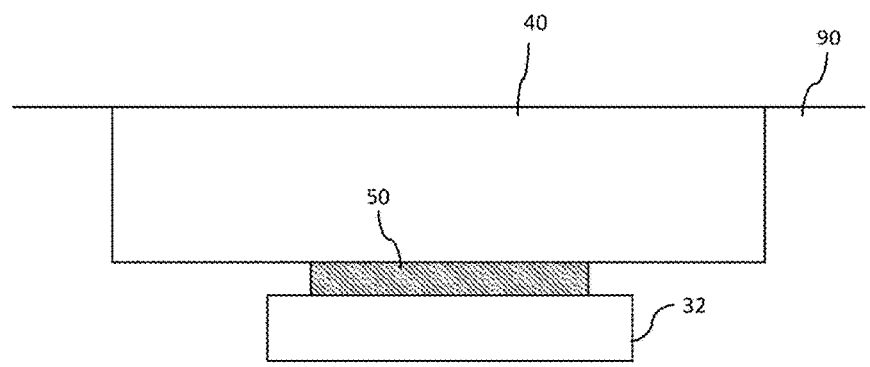
FIG. 8 is a front cross-sectional view of the electronic component applicable to the first embodiment of the present invention as viewed from a right side of FIG. 1.

As shown in FIG. 8, the heat dissipating block 40 may be larger in size in the plane direction than the distal end part 32 of the connecting body 30, and thus the heat dissipating block 40 may extend out of the distal end part 32 of the connecting body 30 in the plane direction.

When the insulating part 50 is made of a heat-dissipating and insulating sheet, it is advantageous in that high heat dissipation can be achieved while maintaining electrical-insulation. Further, when the insulating part 50 is made of a heat-dissipating and insulating material as well, it is advantageous in that high heat dissipation can be achieved while maintaining electrical-insulation.

Even when the insulating part 50 is made of an elastic member having heat-dissipating and insulating properties, it is advantageous in that high heat dissipation can be achieved while maintaining electrical-insulation. In addition to this effect, when the present aspect is employed, it is advantageous in that, during the manufacturing process, the insulating part 50 and the heat dissipating block 40 can be placed on the distal end part 32 of the connecting body 30 with the insulating part 50 pressed by the heat dissipating block 40. In other words, in a case where the insulating part 50 is made of an elastic member, even when the heat dissipating block 40 slightly extends, toward one side, out of a mold into which sealing resin forming the sealing part 90 is poured, the sealing resin can be poured into the mold with the heat dissipating block 40 pressed by the mold. Accordingly, even when the heat dissipating block 40 slightly extends out of the mold in a thickness direction due to a manufacturing error such as an individual difference, it is advantageous in that the electronic component can be manufactured without hindrance. Further, pressing the insulating part 50 in this way can bring fillers included in the insulating part 50 close to each other and can make the heat conductivity higher.

Figure 6:
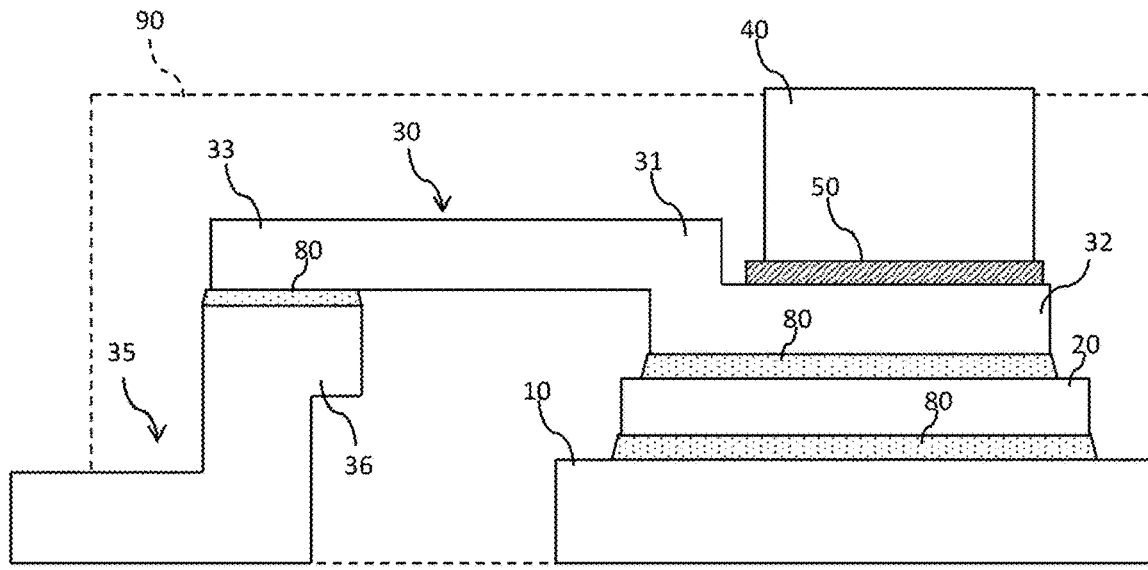
FIG. 6 is a side cross-sectional view of an electronic component applicable to a fourth modification of the first embodiment of the present invention.

When an elastic member having heat-dissipating and insulating properties is used as the insulating part 50, as shown in FIG. 6, the heat dissipating block 40 may be designed to slightly extend, in the thickness direction, out of the mold (sealing part 90) into which the sealing resin is poured. Such a configuration where the heat dissipating block 40 slightly extends can press the insulating part 50, bring the fillers included in the insulating part 50 close to each other, and make the heat conductivity higher. Note that "slightly extend" is equivalent to, for example, extending by a height of 1/10 or less of the thickness of the insulating part 50.

Figure 7:
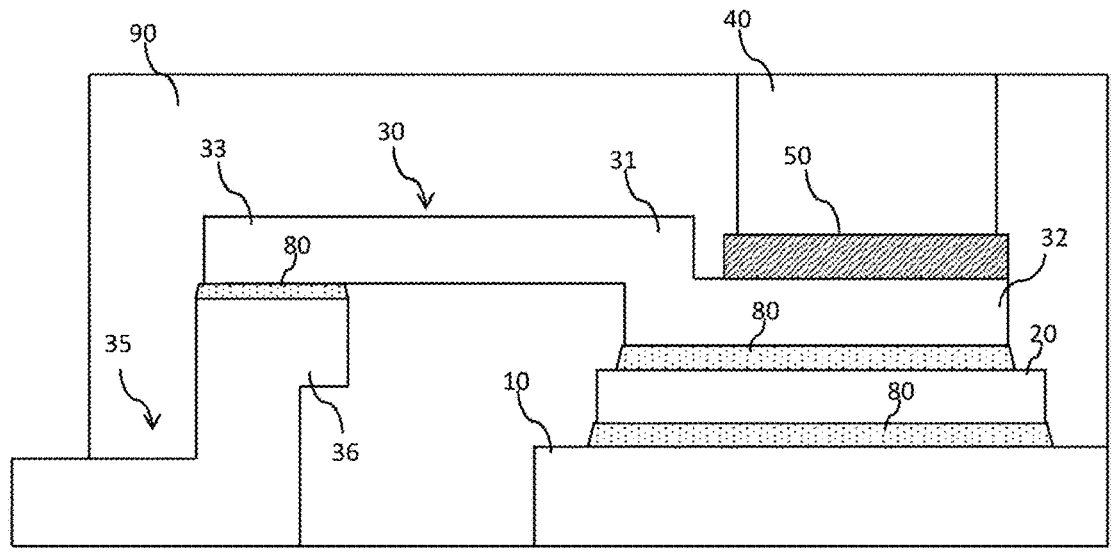
FIG. 7 is a side cross-sectional view of the electronic component applicable to the first embodiment of the present invention, in which a thicker insulating part is employed.

In particular, when the insulating part 50 is made of an elastic member having heat-dissipating and insulating properties, as shown in FIG. 7, an increase in thickness of the insulating part 50 can make elastic force of the insulating part 50 utilized as described above.

Accordingly, in such an aspect, it is advantageous in that the insulating part 50 has a thickness in a range of from 1/3 to 1/2 of the thickness of the distal end part 32 of the connecting body 30.

When an aspect is employed where the proximal end part 33 of the connecting body 30 is in contact with the surface on the one side of the terminal 35 exposed outward from the sealing part 90 via the conductive adhesive 80 such as solder interposed between the proximal end part 33 and the surface on the one side of the terminal 35, it is advantageous in that the terminal 35 itself is prevented from being lifted up even when the proximal end part 33 of the connecting body 30 is lifted up due to that the distal end part 32 of the connecting body 30 is pressed by the mold used for sealing with sealing resin.

In the electronic component, when an aspect is employed where only the heat dissipating block 40 is exposed from the one side of the sealing part 90, heat generated from the electronic element 20 can be dissipated only through a heat path extending through the insulating part 50 and the heat dissipating block 40. In particular, when an object having heat-dissipating and insulating properties such as a heat-dissipating and insulating sheet, a heat-dissipating and insulating material, or an elastic member having heat-dissipating and insulating properties is used as the insulating part 50, it is advantageous in that heat generation from the electronic element 20 can be made more efficiently.

When the base 10, the heat dissipating block 40 and the connecting body 30 are made of the same material, ratios of thermal expansion or thermal contraction caused by heat applied during the manufacturing process can be made identical to each other among the base 10, the heat dissipating block 40, and the connecting body 30. Accordingly, it is advantageous in that making the ratios of thermal expansion or thermal contraction identical to each other between the base 10 and the connecting body 30 can prevent the conductive adhesive 80 between the base 10 and the connecting body 30 from cracking. Further, it is advantageous in that making the ratios of thermal expansion or thermal contraction identical to each other between the connecting body 30 and the heat dissipating block 40 can prevent the connecting body 30 and the heat dissipating block 40 from being misaligned.

Second Embodiment

Next, a description will be given of a second embodiment of the present invention.

Figure 9:
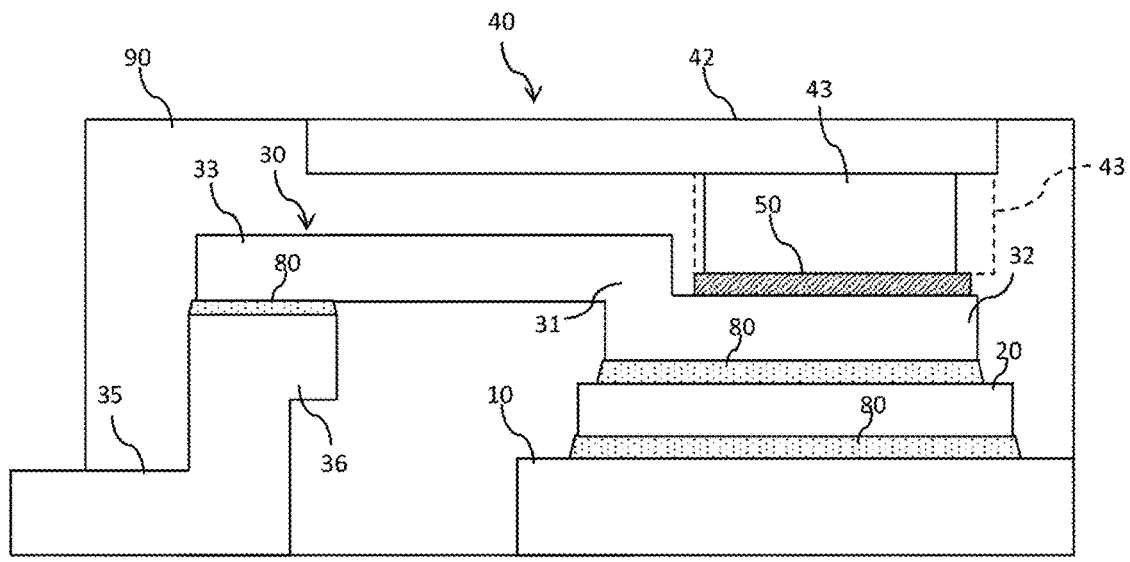
FIG. 9 is a side cross-sectional view of an electronic component applicable to a second embodiment of the present invention.

In the present embodiment, as shown in FIG. 9, the heat dissipating block 40 has the heat dissipating block main part 42 and an extending part 43 extending from the heat dissipating block main part 42 toward the other side. The extending part 43 is provided on the distal end part 32 of the connecting body 30. A surface on one side of the heat dissipating block main part 42 is exposed from the sealing part 90. The other configurations are the same as the configurations of the first embodiment, and any configuration employed in the first embodiment can be employed in the second embodiment. The members described in the first embodiment will be denoted by the same reference numerals.

Providing such an extending part 43 as in the present embodiment can make the heat dissipating block main part 42 largely exposed from the sealing part 90 while causing the extending part 43 to be placed on the distal end part 32 of the connecting body 30. Accordingly, it is advantageous in that high heat dissipation can be achieved.

Figure 10:
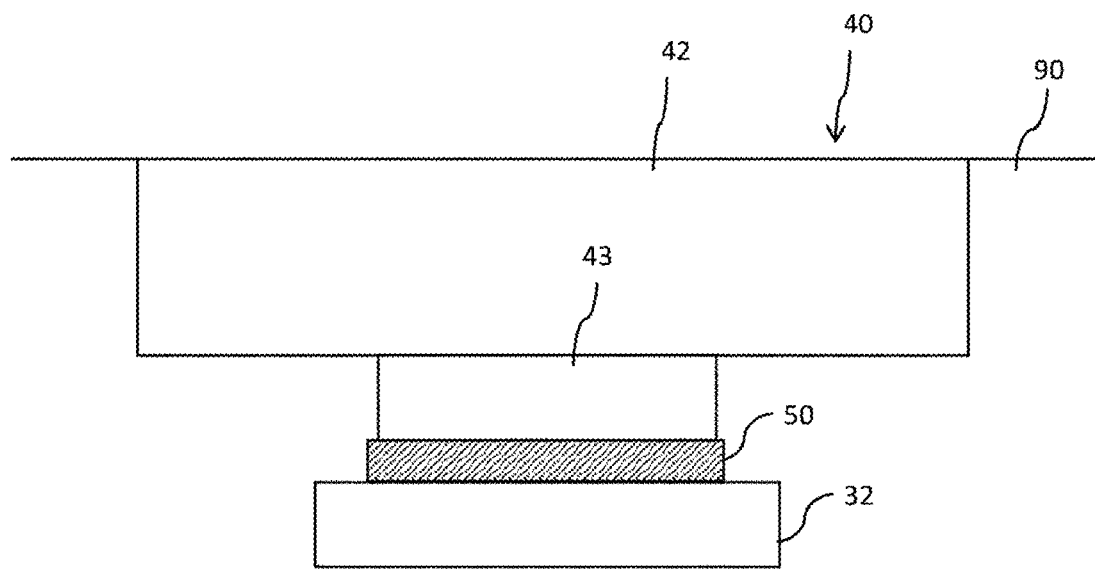
FIG. 10 is a front cross-sectional view of the electronic component applicable to the second embodiment of the present invention as viewed from a right side of FIG. 9.

Further, from the viewpoint of placing the extending part 43 on the distal end part 32 of the connecting body 30, as shown in FIG. 9 and FIG. 10, the extending part 43 may be smaller in area in the plane direction than the distal end part 32 of the connecting body 30. It is advantageous in that the extending part 43 is made smaller in area in the plane direction than the distal end part 32 of the connecting body 30 such that the extending part 43 and the connecting body 30 can be prevented from coming into contact with each other. Note that the present embodiment is not necessarily limited to such an aspect, and the extending part 43 may be larger in area in the plane direction than the distal end part 32 of the connecting body 30, but in this case, some of the extending part 43 on a side away from the bent part 31 (a right side of FIG. 9) extends in the plane direction out of the distal end part 32 (see the reference numeral 43 represented by a dotted line in FIG. 9).

Third Embodiment

Next, a description will be given of a third embodiment of the present invention.

Figure 13:
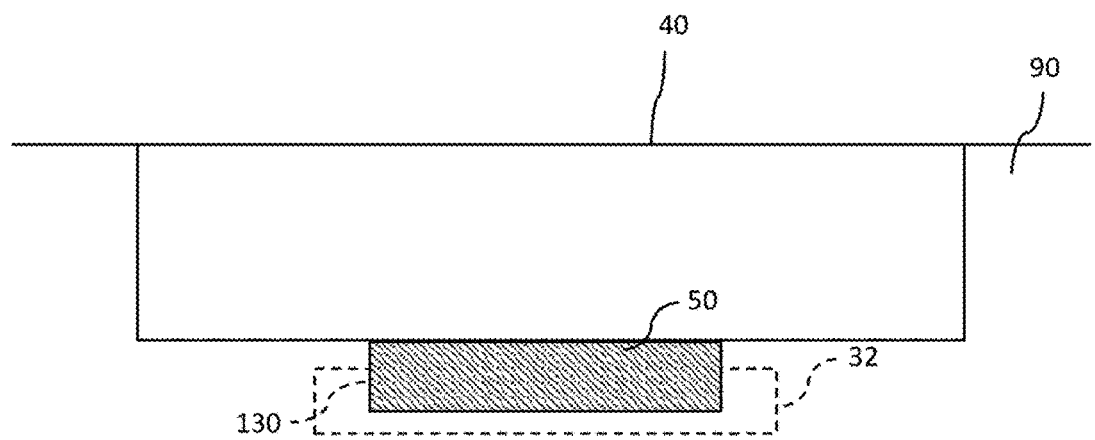
FIG. 13 is a front cross-sectional view of an example of the electronic component applicable to the third embodiment of the present invention.
Figure 14:
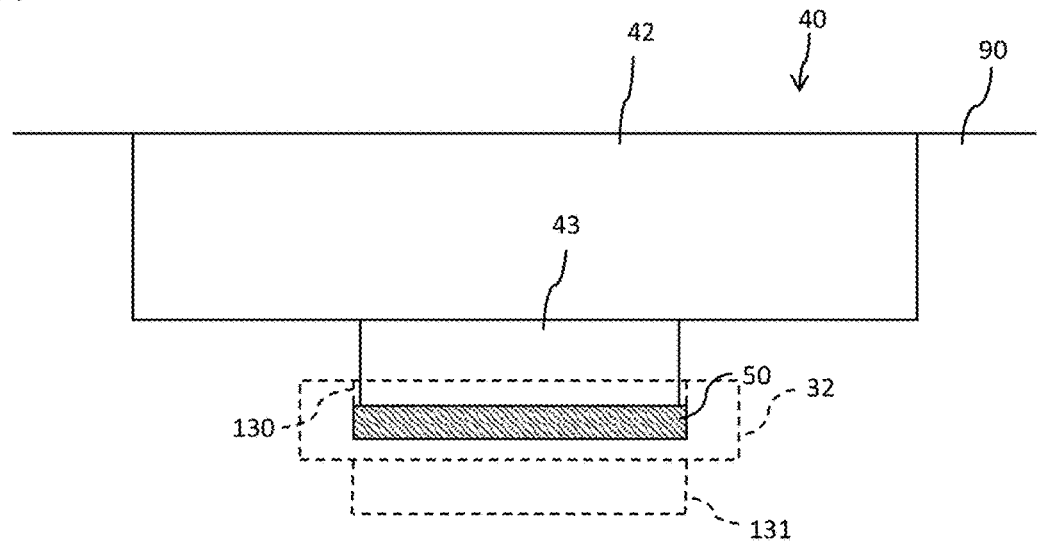
FIG. 14 is a front cross-sectional view of another example of the electronic component applicable to the third embodiment of the present invention.

In the present embodiment, as shown in FIG. 11 and FIG. 12, the distal end part 32 of the connecting body 30 has a recessed part 130. As shown in FIG. 13, the insulating part 50 may be provided in the recessed part 130. Further, as shown in FIG. 14, not only the insulating part 50 but also the extending part 43 of the heat dissipating block 40 may be provided in the recessed part 130. Note that, in the aspect shown in FIG. 14, a gap is provided between the extending part 43 and the distal end part 32 of the connecting body 30 to prevent the extending part 43 and the distal end part 32 from coming into contact with each other. Any configuration employed in the above embodiments can be employed in the third embodiment. The members described in the above embodiments will be denoted by the same reference numerals.

Providing such a recessed part 130 as in the present embodiment can make the insulating part 50 reliably positioned relative to the distal end part 32 of the connecting body 30. This in turn can simplify the manufacturing process of the electronic component.

The recessed part 130 may be formed by hitting the distal end part 32. When such a manufacturing process is employed, a raised part 131 as shown in FIG. 11 can be formed on the surface on the other side of the distal end part 32 by forming the recessed part 130. Further, as shown in FIG. 12, an aspect can be employed where the recessed part 130 is provided, but the raised part 131 is not provided.

Fourth Embodiment

Next, a description will be given of a fourth embodiment of the present invention.

Figure 15:
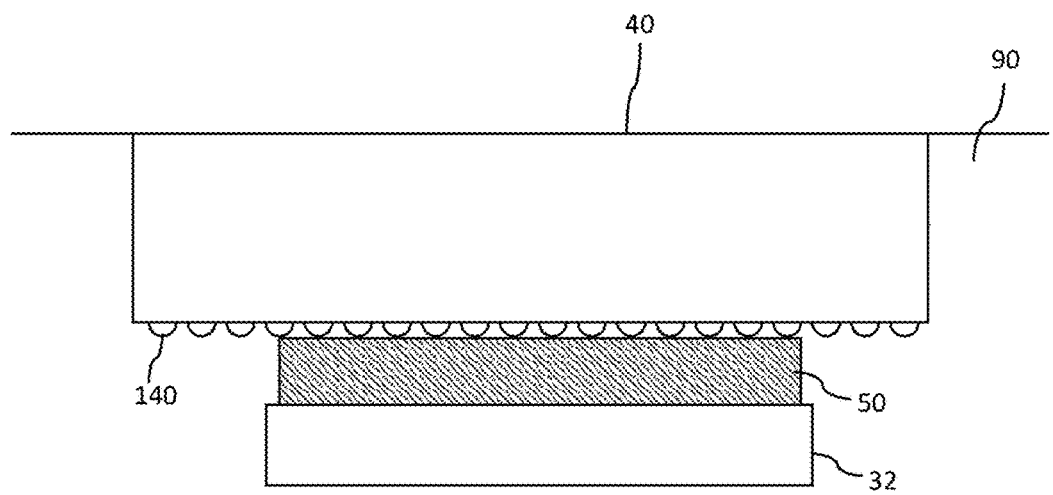
FIG. 15 is a front cross-sectional view of an electronic component applicable to a fourth embodiment of the present invention.

In the present embodiment, as shown in FIG. 15, a surface on the other side of the heat dissipating block 40 has a roughened surface. Any configuration employed in the above embodiments can be employed in the fourth embodiment. The members described in the above embodiments will be denoted by the same reference numerals.

The roughened surface provided on the other side of the heat dissipating block 40 may have fine irregularities 140. Such fine irregularities 140 may be formed by sandblasting. When the other side of the heat dissipating block 40 has such a roughened surface as in the present embodiment, it is advantageous in that the heat dissipating block 40 can prevent the insulating part 50 made of a heat-dissipating and insulating sheet, an elastic material having heat-dissipating and insulating properties, or the like from misaligned in the plane direction.

Figure 16:
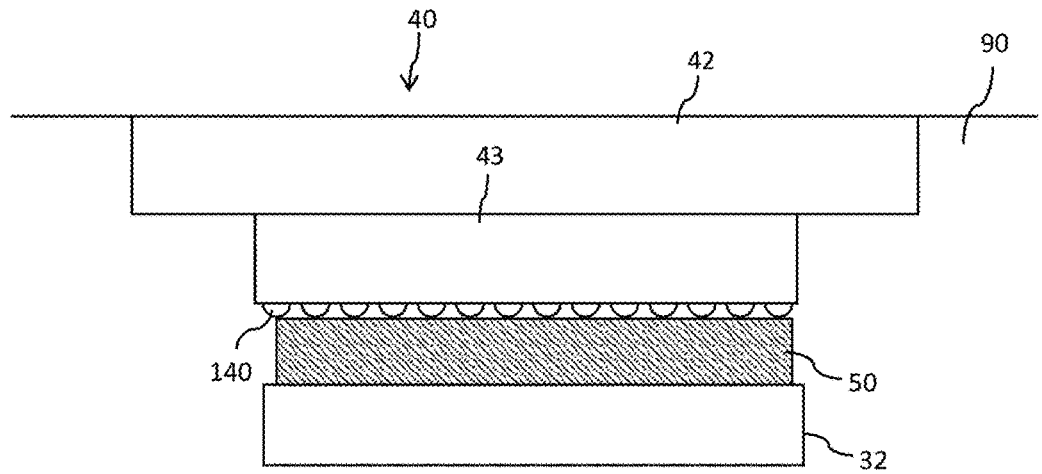
FIG. 16 is a front cross-sectional view of an electronic component applicable to a modification of the fourth embodiment of the present invention.

Note that, in the aspect where the heat dissipating block 40 has the extending part 43, as shown in FIG. 16, the surface on the other side of the extending part 43 of the heat dissipating block 40 may have fine irregularities 140, and the surface on the other side of the heat dissipating block main part 42 need not have irregularities. Further, the present embodiment is not limited to such an aspect, and the surface on the other side of the heat dissipating block main part 42 may have irregularities.

The description of each of the embodiments and the disclosure of the drawings described above are merely examples for explaining the invention recited in the claims, and the invention recited in the claims is not limited by the description of the embodiment or the disclosure of the drawings described above. In addition, the recitation of the claims at the original application is merely an example, and the recitation of the claims can be appropriately changed based on the description of the specification, the drawings, and the like.

REFERENCE SIGNS LIST

10 Base
20 Electronic element
30 Connecting body
31 Bent part
32 Distal end part
35 Terminal
40 Heat dissipating block
42 Heat dissipating block main part
43 Extending part
50 Insulating part
80 Conductive adhesive
90 Sealing part
130 Recessed part

The invention claimed is:

1. An electronic component comprising:
   a base;
   an electronic element provided on one side of the base;
   a connecting body provided on one side of the electronic element;
   a heat dissipating block provided on one side of the connecting body;
   an insulating part provided between the connecting body and the heat dissipating block; and
   a sealing part in which the electronic element, the connecting body and the insulating part are sealed, and wherein
   at least a part of a surface on another side of the base is exposed from the sealing part,
   at least a part of a surface on one side of the heat dissipating block is exposed from the sealing part,
   a distal end part of the connecting body has a recessed part, and
   the insulating part is provided in the recessed part.

2. The electronic component according to claim 1, wherein
   the insulating part is a heat-dissipating and insulating sheet or a heat-dissipating and insulating material.

3. The electronic component according to claim 1, wherein
   a proximal end part of the connecting body is brought into contact with a surface on one side of a terminal exposed outward from the sealing part via a conductive adhesive.

4. The electronic component according to claim 1, wherein
   only the heat dissipating block is exposed from one side of the sealing part.

5. The electronic component according to claim 1, wherein
   the base, the heat dissipating block and the connecting body are made of same material.

6. The electronic component according to claim 1, wherein
   a surface on the other side of the heat dissipating block has a roughened surface.

7. The electronic component according to claim 1, wherein the heat dissipating block has a heat dissipating block main part and an extending part extending from the heat dissipating block main part toward the other side,
   the extending part is provided on one side of a distal end part of the connecting body,
   a surface on one side of the heat dissipating block main part is exposed from the sealing part, and
   the insulating part and the extending part are provided in the recessed part.

\* \* \* \* \*